(12) United States Patent
Dunlap et al.

(10) Patent No.: US 7,433,224 B1
(45) Date of Patent: Oct. 7, 2008

(54) SYSTEM AND METHOD FOR FORCING AN SRAM INTO A KNOWN STATE DURING POWER-UP

(75) Inventors: Frederick S. Dunlap, Longmont, CO (US); John Eitrheim, Farmers Branch, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 765 days.

(21) Appl. No.: 09/477,099

(22) Filed: Jan. 4, 2000

(51) Int. Cl.
*G11C 11/00* (2006.01)

(52) U.S. Cl. ............................. 365/154; 713/2; 365/95; 365/103; 365/189.09

(58) Field of Classification Search ................ 365/154, 365/189, 190, 104, 156, 185.05, 185.07, 365/228, 94, 95, 103, 189.09; 307/279, 571; 713/2
See application file for complete search history.

(56) References Cited

U.S. PATENT DOCUMENTS 4,777,623 A * 10/1988 Shimazu et al. ............. 365/154
5,365,475 A * 11/1994 Matsumura et al. ......... 365/154
5,434,811 A * 7/1995 Evans, Jr. et al. ........... 365/145
5,923,582 A * 7/1999 Voss ........................... 365/154

FOREIGN PATENT DOCUMENTS

JP 06060667 A * 3/1994

* cited by examiner

Primary Examiner—Van Thu Nguyen

(57) ABSTRACT

There is disclosed a static random access memory (SRAM) device that stores an embedded program that is accessible when the SRAM device is powered up. The SRAM device comprises a plurality of storage cells, each of the storage cells comprises a data latch having an input and an output, wherein the data latch comprises a) a first inverter having an input coupled to the first I/O line and an output coupled to the second I/O line, and b) a second inverter having an input coupled to the second I/O line and an output coupled to the first I/O line. The storage cell also comprises a biasing circuit that forces at least one of the first and second I/O lines to a known logic state when power is applied to the SRAM device. The known logic state comprises one bit in the embedded program.

14 Claims, 3 Drawing Sheets

SYSTEM AND METHOD FOR FORCING AN SRAM INTO A KNOWN STATE DURING POWER-UP

TECHNICAL FIELD OF THE INVENTION

The present invention is directed, in general, to processing systems and, more specifically, to a static random access memory (SRAM) containing an embedded program that is accessed at power-up.

BACKGROUND OF THE INVENTION

The continuing demand for faster, smaller, cheaper, lower-power computers requires that state-of-the-art microprocessors execute instructions in the minimum amount of time, space, cost and energy. Conventional personal computers (PCs) usually execute a start-up routine in which the microprocessor executes a boot program stored in a BIOS ROM (or "flash" EPROM) on the motherboard of the PC. The BIOS program then loads the operating system software from a disk drive into main memory. Generally, accessing and executing the boot program in the BIOS ROM is comparatively slow. The BIOS ROM itself occupies board space and has only a limited use after start-up. The BIOS ROM also adds cost to the PC.

It would be more advantageous if a microprocessor could boot up using a static random access memory (SRAM), such an on-chip SRAM in the Level 1 (L1) cache or an SRAM in either an external or an on-chip Level 2 (L2) cache. Then, after the boot-up routine was completed, the microprocessor could reuse the area of the SRAM in which the boot-up routine code was stored as a cache area or dedicated on-chip memory. Unfortunately, the cells in an SRAM "wake up" after a Power-On-Reset (POR) in an unknown state. Thus, the SRAM cannot be used to store, for example, a BIOS program or a self-test program that is accessed and executed at start-up.

Therefore, there is a need in the art for improved processing system designs that eliminate or minimize the need for an external BIOS ROM that is accessed by a microprocessor at start-up. More particularly, there is a need for a microprocessor having an on-chip SRAM cache capable of storing an embedded program that is executed by the microprocessor immediately after power-up.

SUMMARY OF THE INVENTION

The limitations inherent in the prior art described above are overcome by the present invention which provides a biasing (or initializing) circuit that may implemented in each cell of a SRAM device, thereby biasing every cell in the SRAM device to individually selectable known states after power is applied to the SRAM device. Thus, a start-up (or boot-up) program may be embedded in the SRAM device that is immediately available after a power-on-reset occurs.

In an advantageous embodiment of the present invention, there is provided a static random access memory (SRAM) device capable of storing a program that is accessible when the SRAM device is powered up. The SRAM device comprises a plurality of storage cells, each of the storage cells comprising: 1) a data latch having an input and an output, wherein the data latch comprises a) a first inverter having an input coupled to the first I/O line and an output coupled to the second I/O line and b) a second inverter having an input coupled to the second I/O line and an output coupled to the first I/O line; and 2) a biasing circuit capable of forcing at least one of the first and second I/O lines to a known logic state when power is applied to the SRAM device, wherein the known logic state comprises a portion of the program.

As used above, the term "data" should be broadly construed to include instruction bits as well as actual data bits and, in the case of a cache, also includes tags bits, valid bits, and/or dirty bits.

According to one embodiment of the present invention, the biasing circuit initially applies power only to the first inverter.

According to this embodiment, the initial application of power only to the first inverter forces the first inverter output to a Logic 1 state.

Further according to this embodiment, the biasing circuit subsequently applies power to the second inverter.

Still according to this embodiment of the invention, the subsequent application of power to the second inverter forces the second inverter output to a Logic 0 state.

According to another embodiment of the present invention, the biasing circuit initially applies power only to the second inverter.

According to this embodiment of the invention, the initial application of power only to the second inverter forces the second inverter output to a Logic 1 state.

Further according to this embodiment, the biasing circuit subsequently applies power to the first inverter.

According to this embodiment of the invention, the subsequent application of power to the first inverter forces the first inverter output to a Logic 0 state.

According to yet another embodiment of the present invention, the biasing circuit comprises a grounding circuit selectively connected by a programmable contact to one of the first inverter output and the second inverter output, wherein the grounding circuit if temporarily enabled after power is applied to the SRAM device, thereby grounding one of the first inverter output and the second inverter output and forcing the data latch to the known logic state.

An initializing on-chip SRAM according to the principles of the present invention would be useful to store the microcode and other programmable blocks that are currently ROM programmed. This would provide a capability of field reprogramming the microprocessor to fix errors, to add features, or to improve functionality.

Advantageously, an SRAM device according to the principles of the present invention allows a decryption program or decryption codes to be embedded in a processor. Since the decryption program or decryption codes are on-chip and may be erased before the SRAM is accessed by other software programs, the decryption program and/or codes are more secure than when stored in conventional storage devices.

An SRAM device according to the principles of the present invention also provides advantages with respect to newer processor designs that remove the ISA bus common in many legacy designs. Removing the ISA bus frequently requires additional hardware to connect the boot ROM. Replacing the boot ROM with an SRAM according to the present invention eliminates this extra connection circuitry.

In a multi-way set associative cache, it may be advantageous to implement SRAM cells according to the principles of the present invention in only one way of the cache and/or in only the instruction cache. This may save on area, power, and/or complexity. Many boot-up programs can be written in much less than four kilobytes (4K), thereby allowing the boot-up program to fit in one 4K of a 16 kilobyte 4-way set associative instruction cache typical of many current microprocessors.

An SRAM device according to the principles of the present invention also provides advantages in single-chip micro-controller designs that presently contain both an embedded RAM and an embedded ROM. By eliminating the on-chip ROM, the present invention would provide more space for additional RAM.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

Figure 1:
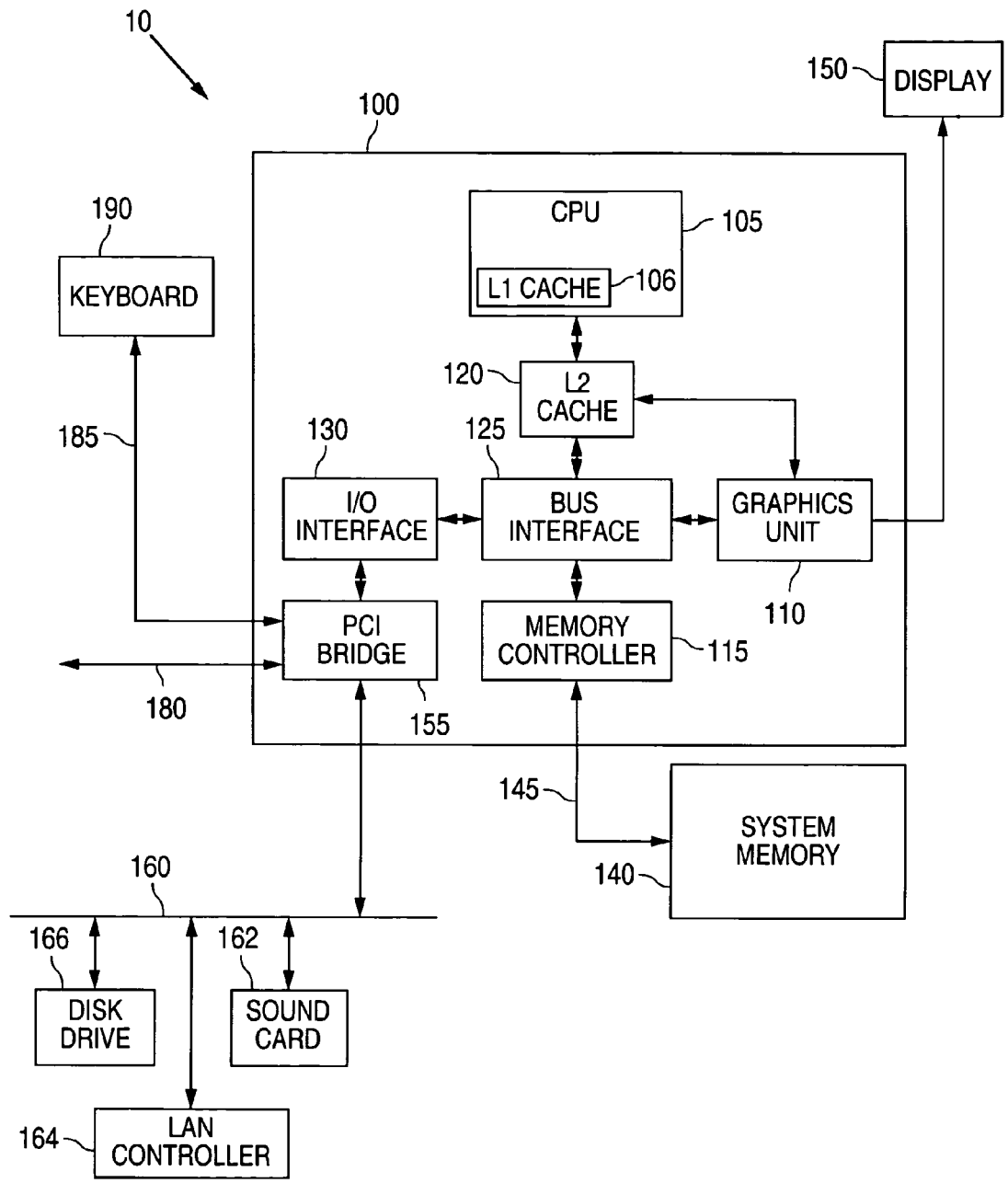
FIG. 1 is a block diagram of an exemplary processing system, which includes an integrated microprocessor according to one embodiment of the present invention.

FIG. 1 is a block diagram of processing system 10, which includes integrated microprocessor 100, according to one embodiment of the present invention. Integrated microprocessor 100 comprises central processing unit (CPU) 105, which may have dual integer and dual floating point execution units, separate load/store and branch units. CPU 105 also comprises L1 cache 106, which contains SRAM cells which may be biased (or initialized) after a power reset according to the principles of the present invention.

Microprocessor 100 also comprises graphics unit 110, system memory controller 115, and L2 cache 120, which is shared by CPU 105 and graphics unit 110. Graphics unit 110, system memory controller 115, and L2 cache 120 may be integrated onto the same die as microprocessor 105. Bus interface unit 125 connects CPU 105, graphics unit 110, and L2 cache 120 to memory controller 115. Bus interface unit 125 also may be integrated onto the same die as microprocessor 105. In an advantageous embodiment of the present invention, L2 cache 120 also may contain SRAM cells which may be biased (or initialized) after a power reset according to the principles of the present invention.

Integrated memory controller 115 bridges microprocessor 100 to system memory 140, and may provide data compression and/or decompression to reduce bus traffic over external memory bus 145 which preferably, although not exclusively, has a RAMbus™, fast SDRAM or other type protocol. Integrated graphics unit 110 provides TFT, DSTN, RGB, or other types of video output to drive display 150.

Bus interface unit 125 connects microprocessor 100 through I/O interface 130 to PCI bridge 155, which has a conventional peripheral component interconnect (PCI) bus interface on PCI bus 160 to one or more peripherals, such as sound card 162, LAN controller 164, and disk drive 166, among others. Bus interface unit 125 also connects fast serial link 180 and relatively slow I/O port 185 to microprocessor 100 (via I/O interface 130 and PCI bridge 155). Fast serial link 180 may be, for example, an IEEE 1394 bus (i.e., "Firewire") and/or a universal serial bus ("USB"). I/O port 185 is used to connect peripherals to microprocessor 100, such as keyboard 190 and/or a mouse. In some embodiments, PCI bridge 155 may integrate local bus functions such as sound, disk drive control, modem, network adapter, and the like.

In one embodiment of the present invention, L1 cache 106 may comprise a plurality of SRAM cells that may be biased (or initialized) to a particular logic state (Logic 1 or Logic 0) during a power reset. In one embodiment, L1 cache 106 may comprise a 16 kilobyte L1 instruction (I) cache that is single-ported 4-way associative, with 2 pending misses. L1 cache 106 also may comprise a 16 kilobyte L1 data (D) cache that is non-blocking, dual-ported (one load port and one store/fill port), 4-way associative, with 4 pending misses. Both the data and instruction portions of L1 cache 106 may be indexed with the linear address and physically tagged with the TLB (translated) address. In response to L1 misses, L2 cache 120 transfers an entire cache line (32 bytes/256 bits) in one cycle with a seven clock access latency for L1 misses that hit in L2 cache 120.

In one embodiment of the present invention, L2 cache 120 also may comprise a plurality of SRAM cells that may be biased (or initialized) to a particular logic state during a power reset. L2 cache 120 may be an 8-way associative and 8-way interleaved. Each interleave supports one L1 (code/data) miss per cycle, and either one L1 store or one L2 fill per cycle.

Portions or all of two of the eight ways may be locked down for use by graphics controller 110.

Figure 2:
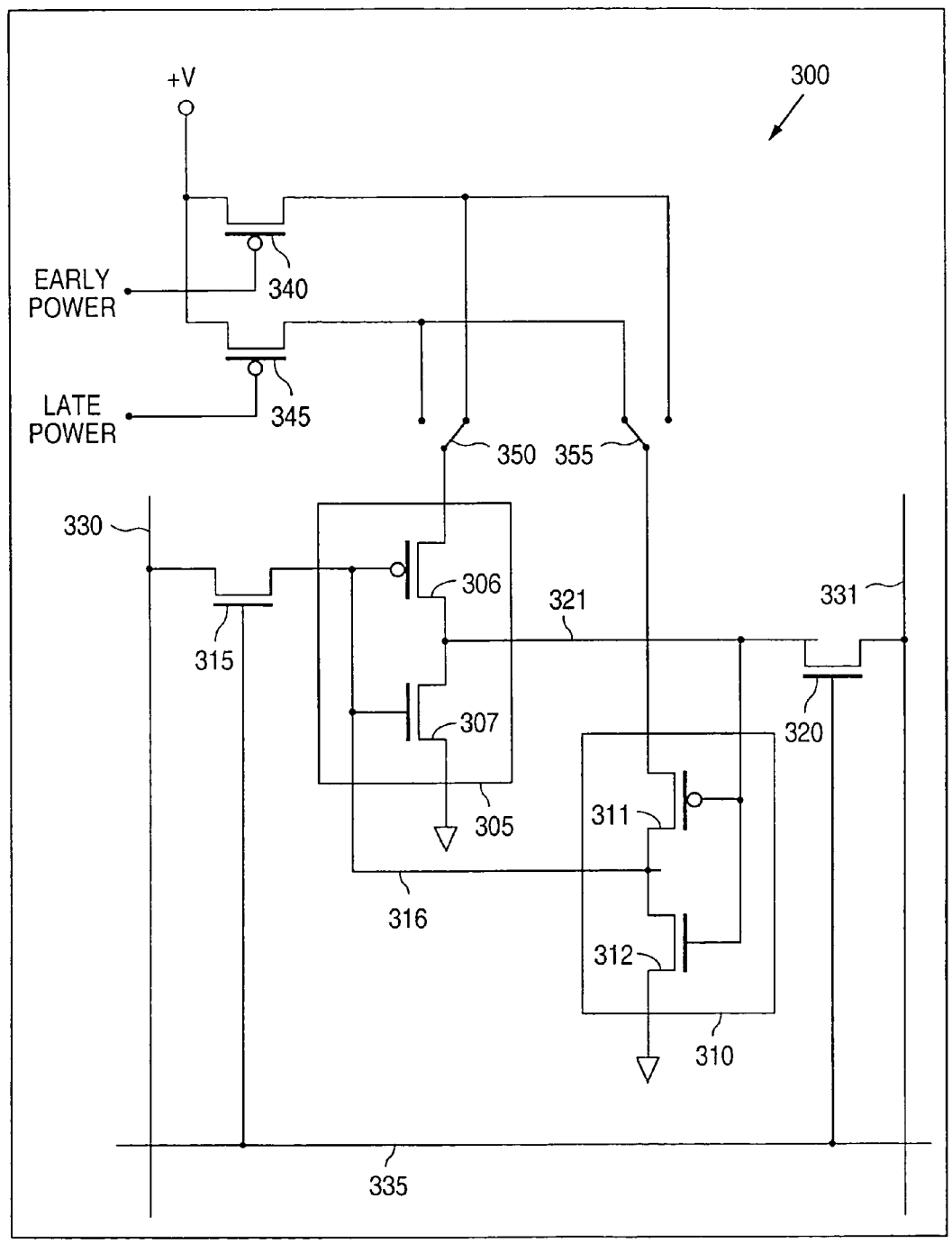
FIG. 2 illustrates an exemplary SRAM cell for use in the L1 cache or the L2 cache in the exemplary microprocessor according to one embodiment of the present invention.

FIG. 2 illustrates exemplary SRAM cell 300 for use in L1 cache 106 in CPU 105 or L2 cache 120 according to one embodiment of the present invention. SRAM cell 300 comprises CMOS inverters 305 and 310, n-type MOS transfer gate transistors 315 and 320, column line 330, column line 331, row line 335, and p-type MOS transistors 340 and 345. SRAM cell 300 further comprises programmable contacts 350 and 355, either of which may be connected during fabrication to transistor 340 or transistor 345, as shown. In the embodiment shown, programmable contact 350 is connected to transistor 340 and programmable contact 355 is connected to transistor 345. As will be explained below in greater detail, the connection of programmable contacts 350 and 355 determines whether SRAM cell 300 initially comes up with a Logic 1 or Logic 0 state after power is applied.

CMOS inverter 305 comprises p-type transistor 306 and n-type transistor 307 and CMOS inverter 310 comprises p-type transistor 311 and n-type transistor 312. The output line 321 of inverter 305 is connected to the input of inverter 310 and the output line 316 of inverter 310 is connected to the input of inverter 305, forming a latch for data storage. The power ground reference is supplied to inverters 305 and 310 through the drain connection on transistors 307 and 312. Inverters 305 and 310 are connected to the +V power supply rail through the source connections of transistors 306 and 311 and either power transistor 340 or power transistor 345. Transistor 306 is connected 350 and transistor 311 is connected to the +V power supply transistor through programmable contact 355.

Transistors 315 and 320 are open when row line 335 is a low voltage (or Logic 0), providing high impedances to column line 330 and column line 331. When row line 335 is a high voltage or logic 1, transistor 315 closes to transfer the state of column line 330 to the input of inverter 305 or to transfer the output of inverter 310 to column line 330, and transistor 320 closes to transfer the output of inverter 305 to column line 331 or to transfer the state of column line 331 to the input of inverter 310.

Immediately after power is applied (or reset) in L1 cache 106 or L2 cache 120 (i.e., at time t=t0), the EARLY POWER signal and the LATE POWER signals are driven to high (i.e., to Logic 1), effectively disconnecting the +V power supply rail from inverters 305 and 310. At the same time, row line 335 is driven high, thereby turning "ON" transistors 315 and 320, and column lines 330 and 331 are driven low (i.e., to Logic 0). Since output line 321 of inverter 305 is essentially shorted to column line 331 by transistor 320, output line 321 is discharged to ground (I.E., Logic 0). Since output line 316 of inverter 310 is essentially shorted to column line 330 by transistor 315, output line 316 also is discharged to ground (i.e., Logic 0). SRAM cell 300 is held in this state for a short period of time to allow internal output lines 321 and 316 to discharge to a Logic 0.

At a later time (t=t1), row line 335 is driven low, thereby open-circulating transistors 315 and 320. At this point, output line 316 and output line 320 remain at Logic 0, but are capable of being changed. Column lines 330 and 331 are also released and are no longer held to Logic 0.

At a later time (t=t2), the EARLY POWER signal goes low (i.e., to Logic 0), closing transistor 340 and connecting the +V power to inverter 305. Since the input to inverter 305 is Logic 0 (from output line 316 of inverter 305), output line 321 of inverter 305 goes to Logic 1.

At a later time (t=t3), the LATE POWER signal goes low at the gate of transistor 345. Transistor 345 closes and the +V power is supplied to inverter 310. Since the input to inverter 310 is Logic 1 (from output line 321 of inverter 305), the output of inverter 310 goes to Logic 0, which then is inverted by inverter 305, reinforcing the Logic 1 already on output line 321 of inverter 305. Thus, the initial programmed Logic 1 output of inverter 305 is maintained as a Logic 1 by the latch comprised of inverters 305 and 310.

Data is written to SRAM cell 300 when row line 335 is driven high, thereby closing transistor 315 and transferring the value on column line 330 to the input of inverter 305 for storage and also closing transistor 320 and transferring the value on column line 331 for storage. The values on column lines 330 and 331 are always complementary. SRAM cell 300 is read when column lines 330 and 331 are floating and row line 335 drives the gates of transistor 320 and transistor 315 high. This closes transistor 320 and transfers the Logic 1 or Logic 0 stored on output line 321 of inverter 305 to column line 331. Transistor 315 is also closed, which transfers the Logic 0 or Logic 1 stored on output line 316 of inverter 310 to column line 330.

If Logic 0 is desired as the initial power-up output from SRAM cell 300, programmable contact 350 is connected to transistor 345 and programmable contact 355 is connected to transistor 340. The EARLY POWER and LATE POWER signals and the +V power supply are applied as before. This time, however, the +V power is first applied to inverter 310, causing it output to go to Logic 1. The subsequent application of the +V power to inverter 305 then causes the output of inverter to go to Logic 0. This is the initial state of SRAM cell 300.

Since the fabrication process can connect contacts 350 and 355 to either the EARLY POWER transistor 340 or the LATE POWER transistor 345, each cell in L1 cache 106 or L2 cache 120 may be programmed as a Logic 1 or a Logic 0 after power up. In this manner, a boot-up program may be stored in L1 cache 106 or L2 cache 120 and executed after power is applied to CPU 105 and microprocessor 100. Advantageously, this on-chip boot-up program may comprise, among other things a decryption program or decryption codes, which may be erased before the SRAM is accessed by other software programs.

Figure 3:
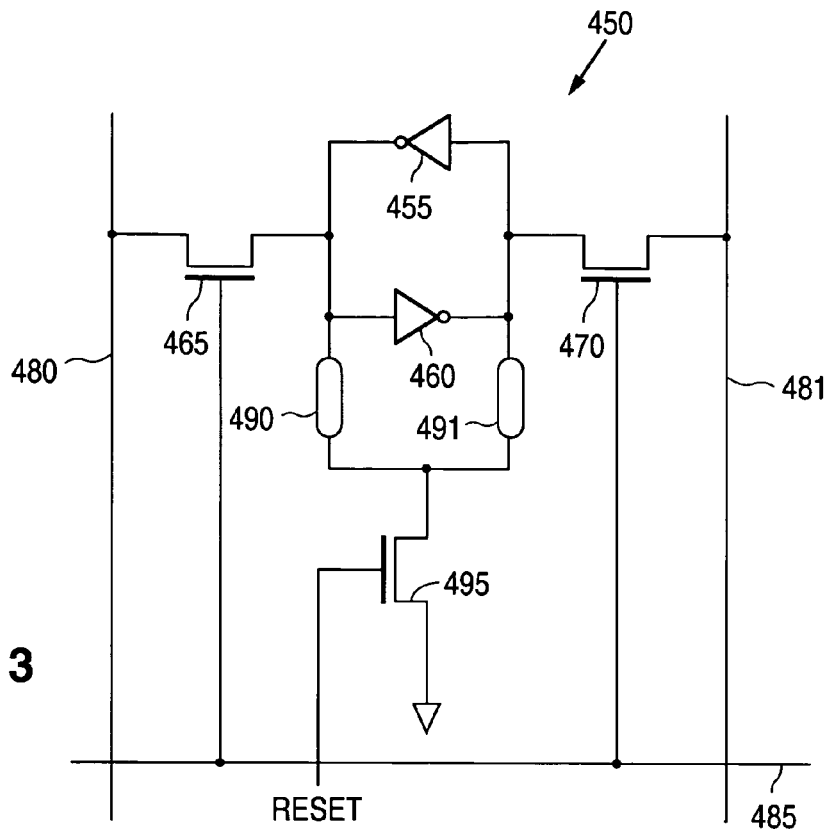
FIG. 3 illustrates an exemplary SRAM cell for use in the L1 cache or the L2 cache in the exemplary microprocessor according to another embodiment of the present invention.

FIG. 3 illustrates exemplary SRAM cell 450 for use in L1 cache 106 in CPU 105 or L2 cache 120 according to another embodiment of the present invention. SRAM cell 450 comprises inverters 455 and 460, n-type MOS transistors 465, 470, and 495, column line 480, column line 481, row line 485, and programmable connects 490 and 491. Transistor 495 is configured so that its drain is connected to ground, its gate is connected to a reset signal (reset) which is normally Logic 0 (OFF), and its source is connected to one side of programmable connects 490 and 491. The other side of programmable connect 490 is connected to the output of inverter 455 and the input of inverter 460. The other side of programmable connect 491 is connected to the output of inverter 460 and the input of inverter 455.

Depending upon the desired initial output for the latch formed with inverters 455 and 460, programmable connect 490 or programmable connect 491 is installed during fabrication. If a Logic 1 is desired initially at column line 481 when row line 485 is high, programmable connect 491 is removed. Otherwise, if a Logic 0 is desired as the initial power-up state, programmable connect 490 is removed.

When power is initially applied, column line 480, column 481 and row line 485 are Logic 0. Shortly after power is applied, the RESET signal goes to Logic 1 on the gate of transistor 495, which shorts the drain of transistor 495 to ground. If programmable connect 491 has been removed and programmable connect 490 remains, programmable connect 490 pulls the output of inverter 455 (and the input of inverter 460) to ground (Logic 0). Inverter 460 inverts the Logic 0 on its input to a Logic 1 on its output. This is the value stored in SRAM cell 450 after power up. Inverter 455 inverts the Logic 1 from inverter 460 to a Logic 0. Once the RESET returns to Logic 0, transistor 495 opens and the latch formed by inverters 455 and 460 maintains a Logic 1 at the output of inverter 460.

In an similar manner, SRAM cell 450 could have powered-up to a Logic 0 by removing programmable connect 490 and leaving programmable connect 491 connected between the drain of transistor 495 and the output of inverter 460.

As similarly described for SRAM cell 300, when row line 485 is high, the output of the latch formed by inverters 455 and 460 is transferred to column lines 481 and 480 during a read operation and the value on column lines 480 and 481 can be forced into the input of the latch during a write operation. The initial programmed stored state of the latch formed by inverters 455 and 460 is maintained until column lines 480 and 481 cause the latch to switch to the other state.

Figure 4:
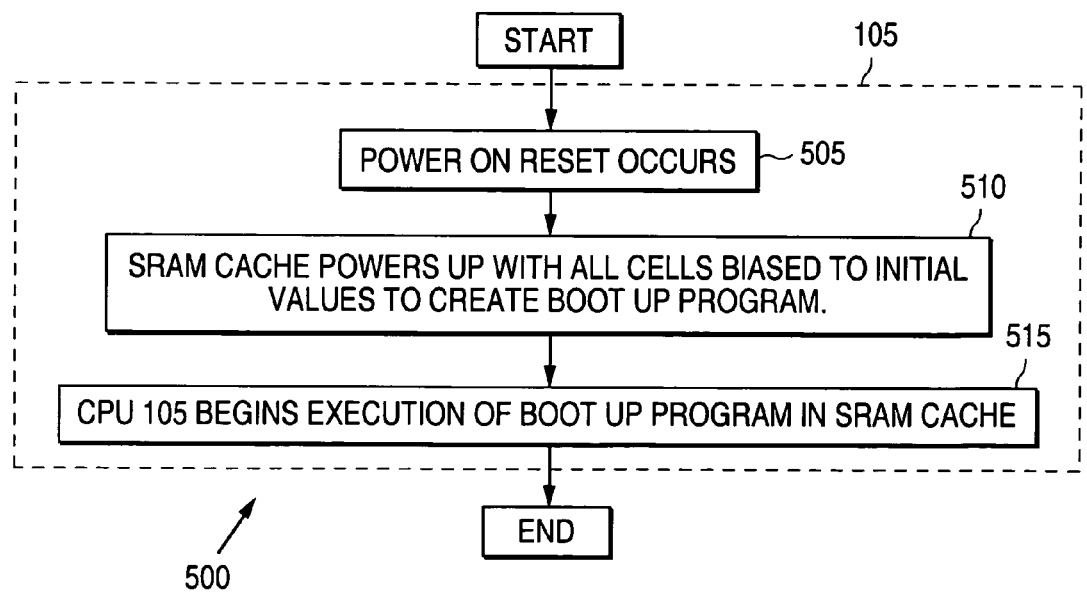
FIG. 4 is a flow diagram illustrating the operation of the exemplary CPU according to one embodiment of the present invention.

FIG. 4 depicts flow diagram 500, which illustrates the operation of the exemplary CPU 105 according to one embodiment of the present invention. First, a power-on-reset event occurs, providing a short reset signal which enables the L1 cache (or L2 cache) initialization process to begin (process step 505). In one embodiment, L1 cache 106 (or L2 cache 120) powers up with individual SRAM cells biased to values required for the boot-up program, as described above with respect to FIGS. 2 and 3 (process step 510). Next, CPU 105 begins execution of the boot-up program stored in L1 cache 106 or L2 cache 120 (process step 515).

Although the present invention has been described in detail, those skilled in the art should understand that they can make various changes, substitutions and alterations herein without departing from the spirit and scope of the invention in its broadest form.

What is claimed is:

1. A static random access memory (SRAM) device capable of storing a program that is accessible when said SRAM device is powered up, said SRAM device comprising a plurality of storage cells, each of said storage cells comprising:
    a data latch having a first input/output (I/O) line and a second I/O line, said data latch comprising:
        a first inverter having an input coupled to said first I/O line and an output coupled to said second I/O line;
        a second inverter having an input coupled to said second I/O line and an output coupled to said first I/O line; and
    a biasing circuit capable of forcing at least one of said first and second I/O lines to a known logic state when power is applied to said SRAM device, wherein said known logic state comprises a portion of said program, said biasing circuit comprising a grounding circuit selectively connected by a programmable connect to one of said first inverter output and said second inverter output, wherein said grounding circuit is temporarily enabled after power is applied to said SRAM device, thereby grounding one of said first inverter output and said second inverter output and forcing said second I/O line to said known logic state.

2. A data processor comprising a central processing unit (CPU) capable of executing a boot-up program when power is applied to said CPU, said CPU comprising:
    a static random access memory (SRAM) device capable of storing said boot-up program, said SRAM device comprising a plurality of storage cells capable of storing said boot-up program, each of said storage cells comprising:
        a data latch having an input and an output, said data latch comprising:
            a first inverter having an input coupled to said first I/O line and an output coupled to said second I/O line;
            a second inverter having an input coupled to said second I/O line and an output coupled to said first I/O line; and
        a biasing circuit capable of forcing at least one of said first and second I/O lines to a known logic state when power is applied to said SRAM device, wherein said known logic state comprises a portion of said boot-up program, said biasing circuit comprising a grounding circuit selectively connected by a programmable connect to one of said first inverter output and said second inverter output, wherein said grounding circuit is temporarily enabled after power is applied to said SRAM device, thereby grounding one of said first inverter output and said second inverter output and forcing said second I/O line to said known logic state.

3. The data processor as set forth in claim 2 wherein said biasing circuit initially applies power only to said first inverter.

4. The data processor as set forth in claim 3 wherein said biasing circuit subsequently applies power to said second inverter.

5. The data processor as set forth in claim 4 wherein:
    said initial application of power only to said first inverter configures said first inverter output to a Logic 1 state; and
    said subsequent application of power to said second inverter configures said second inverter output to a Logic 0 state.

6. The data processor as set forth in claim 4 wherein:
    said initial application of power only to said second inverter configures said second inverter output to a Logic 1 state; and
    said subsequent application of power to said first inverter configures said first inverter output to a Logic 1 state.

7. The data processor as set forth in claim 2 wherein said grounding circuit comprises a first transistor comprising a first node coupled to a voltage reference, a second node selectively connected by the programmable connect to one of said first inverter output and said second inverter output and a gate node operable to receive a signal to temporarily enable the grounding circuit after power is applied to said SRAM device.

8. The data processor as set forth in claim 7, wherein said grounding circuit further comprises a second transistor comprising a first node coupled to the voltage reference, a second node selectively connected by a second programmable connect to one of said first inverter output and said second inverter output and a gate node operable to receive the signal to temporarily enable the grounding circuit after power is applied to said SRAM, wherein said second node of said first transistor and said second node of said second transistor are selectively coupled to different outputs of said first inverter output and said second inverter output and wherein said second transistor is an opposite bias type as said first transistor.

9. The SRAM device as set forth in claim 1 wherein said biasing circuit initially applies power only to said first inverter.

10. The SRAM device as set forth in claim 9 wherein said biasing circuit subsequently applies power to said second inverter.

11. The SRAM device as set forth in claim 10 wherein:
said initial application of power only to said first inverter configures said first inverter output to a Logic 1 state; and
said subsequent application of power to said second inverter configures said second inverter output to a Logic 0 state.

12. The SRAM device as set forth in claim 10 wherein:
said initial application of power only to said second inverter configures said second inverter output to a Logic 1 state; and
said subsequent application of power to said first inverter configures said first inverter output to a Logic 1 state.

13. The SRAM device as set forth in claim 1 wherein said grounding circuit comprises a first transistor comprising a first node coupled to a voltage reference, a second node selectively connected by the programmable connect to one of said first inverter output and said second inverter output and a gate node operable to receive a signal to temporarily enable the grounding circuit after power is applied to said SRAM device.

14. The SRAM device as set forth in claim 13 wherein said grounding circuit further comprises a second transistor comprising a first node coupled to the voltage reference, a second node selectively connected by a second programmable connect to one of said first inverter output and said second inverter output and a gate node operable to receive the signal to temporarily enable the grounding circuit after power is applied to said SRAM, wherein said second node of said first transistor and said second node of said second transistor are selectively coupled to different outputs of said first inverter output and said second inverter output and wherein said second transistor is an opposite bias type as said first transistor.

* * * * *